United States Patent
Eguchi

(10) Patent No.: US 11,043,881 B2
(45) Date of Patent: Jun. 22, 2021

(54) COMPONENT-MOUNTING DEVICE AND ELECTRONIC APPARATUS

(71) Applicant: KYB CORPORATION, Tokyo (JP)

(72) Inventor: Yuu Eguchi, Tokyo (JP)

(73) Assignee: KYB CORPORATION, Tokyo (JP)

( * ) Notice: Subject to any disclaimer, the term of this patent is extended or adjusted under 35 U.S.C. 154(b) by 0 days.

(21) Appl. No.: 16/651,150

(22) PCT Filed: Aug. 27, 2018

(86) PCT No.: PCT/JP2018/031560
§ 371 (c)(1),
(2) Date: Mar. 26, 2020

(87) PCT Pub. No.: WO2019/065036
PCT Pub. Date: Apr. 4, 2019

(65) Prior Publication Data
US 2020/0295630 A1    Sep. 17, 2020

(30) Foreign Application Priority Data
Sep. 28, 2017  (JP) .............................. JP2017-188167

(51) Int. Cl.
*H05K 7/00* (2006.01)
*H05K 5/00* (2006.01)
(Continued)

(52) U.S. Cl.
CPC .......... *H02K 11/30* (2016.01); *H05K 7/1407* (2013.01)

(58) Field of Classification Search
CPC .... H02K 11/30; H02K 11/00; H02K 11/0094; H05K 7/1407; H05K 7/1402; H05K 7/1401; H05K 7/14
See application file for complete search history.

(56) References Cited

U.S. PATENT DOCUMENTS 9,431,881 B2 *  8/2016  Clendenen .............. H02K 11/33
10,848,042 B2 * 11/2020 Beyerl .................... H02K 11/33
(Continued)

FOREIGN PATENT DOCUMENTS

| JP | 2016-033986 A | 3/2016 |
| JP | 2016-036243 A | 3/2016 |
| JP | 2016-116274 A | 6/2016 |

OTHER PUBLICATIONS

International Search Report dated Nov. 6, 2018 in International Application No. PCT/JP2018/031560.

*Primary Examiner* — Anthony M Haughton
(74) *Attorney, Agent, or Firm* — Saliwanchik, Lloyd & Eisenschenk

(57) ABSTRACT

A component-mounting device according to an embodiment of the present invention includes a component-mounting board, a connector component, a heat sink, and a first screw portion. The component-mounting board includes a first surface and a second surface opposite to the first surface. The connector component includes a plurality of terminal-fixing portions that fixes a terminal extending in one axis direction orthogonal to the first surface and a base portion that connects between the plurality of terminal-fixing portions and includes an opening portion, the connector component being provided on the first surface. The heat sink faces the second surface and includes a first screw seat that faces the base portion in the one axis direction with the component-mounting board interposed between the first screw seat and the base portion. The first screw portion is disposed inside the opening portion and is engaged with the first screw seat through the component-mounting board.

6 Claims, 7 Drawing Sheets

(51) Int. Cl.
*H02K 11/30* (2016.01)
*H05K 7/14* (2006.01)

(56) References Cited

U.S. PATENT DOCUMENTS

| | | | | |
|---|---|---|---|---|
| 2005/0121986 A1* | 6/2005 | Matsuki | ............... | H05K 1/0203 |
| | | | | 310/64 |
| 2006/0158049 A1* | 7/2006 | Suzuki | ................... | H02K 11/33 |
| | | | | 310/52 |
| 2011/0254388 A1* | 10/2011 | Yamasaki | ............ | B62D 5/0406 |
| | | | | 310/43 |
| 2013/0234548 A1* | 9/2013 | Oishi | ..................... | H02K 5/225 |
| | | | | 310/71 |
| 2013/0249335 A1* | 9/2013 | Motoda | .............. | H02K 11/0094 |
| | | | | 310/71 |
| 2013/0257193 A1* | 10/2013 | Toda | ....................... | H02K 5/10 |
| | | | | 310/52 |
| 2015/0333589 A1* | 11/2015 | De Filippis | ............ | H02K 11/00 |
| | | | | 310/71 |
| 2016/0036306 A1 | 2/2016 | Yamasaki et al. | | |
| 2016/0094106 A1* | 3/2016 | Yamasaki | ................ | H02K 3/28 |
| | | | | 310/71 |

* cited by examiner

COMPONENT-MOUNTING DEVICE AND ELECTRONIC APPARATUS

CROSS-REFERENCE TO RELATED APPLICATIONS

This application is the U.S. national stage application of International Patent Application No. PCT/JP2018/031560, filed Aug. 27, 2018, which claims the benefit under 35 U.S.C. § 119 of Japanese Patent Application No. 2017-188167, filed Sep. 28, 2017, the disclosures of each of which are incorporated herein by reference in their entirety.

TECHNICAL FIELD

The present invention relates to a component-mounting device including a circuit board fixed with screws and an electronic apparatus including the same.

BACKGROUND ART

There is known an electronic apparatus including an electric motor, a component-mounting board (circuit board) on which a control circuit that drives the electric motor is mounted, and a casing that houses the electric motor and the component-mounting board, for example. For instance, Patent Literature 1 has disclosed a motor unit with a rotor, a stator, and a motor drive control device attached to a lower case, the motor unit having a configuration in which the motor drive control device includes a component-mounting board and a heat sink attached to the component-mounting board with a plurality of fixing bolts.

CITATION LIST

Patent Literature

Patent Literature 1: Japanese Patent Application Laid-open No. 2016-33986

DISCLOSURE OF INVENTION

Technical Problem

For assembling into such an electronic apparatus, it is sometimes necessary to press-fit and fix a motor busbar terminal to a connector component mounted on the component-mounting board. In this case, unnecessary bending stress may be applied on the board, and the board may be damaged and the quality of the electronic apparatus may be lowered.

In view of the above-mentioned circumstances, it is an object of the present invention to provide a component-mounting device capable of inhibiting the quality from lowering due to deformation of the circuit board and an electronic apparatus including the same.

Solution to Problem

In order to accomplish the above-mentioned object, a component-mounting device according to an embodiment of the present invention includes a component-mounting board, a connector component, a heat sink, and a first screw portion.

The component-mounting board includes a first surface and a second surface opposite to the first surface.

The connector component includes a plurality of terminal-fixing portions that fixes a terminal extending in one axis direction orthogonal to the first surface and a base portion that connects between the plurality of terminal-fixing portions and includes an opening portion, the connector component being provided on the first surface.

The heat sink faces the second surface and includes a first screw seat that faces the base portion in the one axis direction with the component-mounting board interposed between the first screw seat and the base portion.

The first screw portion is disposed inside the opening portion and is engaged with the first screw seat through the component-mounting board.

In accordance with this configuration, the first screw seat supports the component-mounting board within a region that faces the connector component with the component-mounting board interposed therebetween. Accordingly, bending stress to the component-mounting board due to press-fitting of a terminal of a motor busbar or the like in the terminal-fixing portion is reduced. Therefore, in accordance with the present invention, the quality of the electronic apparatus can be inhibited from lowering due to deformation of the component-mounting board.

The component-mounting board may further include a heat-generating component mounted on the second surface, and the first screw seat may have a height such that the heat-generating member is thermally connected to the heat sink.

Accordingly, with the component-mounting board fixed to the heat sink, the heat dissipation property of the component-mounting board is maintained.

The heat-generating component may include a metal, heat dissipation electrode, the component-mounting device further including a grease layer that is provided between the heat dissipation electrode and the heat sink and thermally connects the heat dissipation electrode to the heat sink.

Accordingly, for example, a portion of the heat-generating component, at which the temperature can be high, is exposed on the heat sink side as the heat dissipation electrode. In this manner, heat can be made to escape through the grease layer. The heat dissipation property is thus enhanced.

The heat-generating component may be at least partly mounted on the second surface within a region that faces the connector component in the one axis direction with the component-mounting board interposed between the region and the connector component.

Accordingly, the heat-generating component and the heat sink can be securely thermally connected to each other.

The connector component may include a plurality of base portions includes the base portion that connects between respective ones of the plurality of terminal-fixing portions and first and second opening portions formed in the plurality of base portions, the first screw portion may be disposed in the first opening portion, and the first surface may include an identifier disposed in the second opening portion.

In order to accomplish the above-mentioned object, an electronic apparatus according to an embodiment of the present invention includes a motor, a busbar unit, and a component-mounting device.

The busbar unit electrically connects to the motor and includes a terminal that extends in one axis direction.

The component-mounting device includes a component-mounting board, a connector component, a heat sink, and a screw portion.

The component-mounting board includes a first surface and a second surface opposite to the first surface.

The connector component includes a plurality of terminal-fixing portions that fixes the terminal and a base portion that connects between the plurality of terminal-fixing portions and includes an opening portion, the connector component being provided on the first surface.

The heat sink faces the second surface and includes a screw seat that faces the base in the one axis direction with the component-mounting board interposed between the screw seat and the base.

The screw portion is disposed inside the opening portion and is engaged with the screw seat through the component-mounting board.

MODE(S) FOR CARRYING OUT THE INVENTION

Hereinafter, an embodiment of the present invention will be described with reference to the drawings.

<Configuration of Electronic Apparatus>

Figure 1:
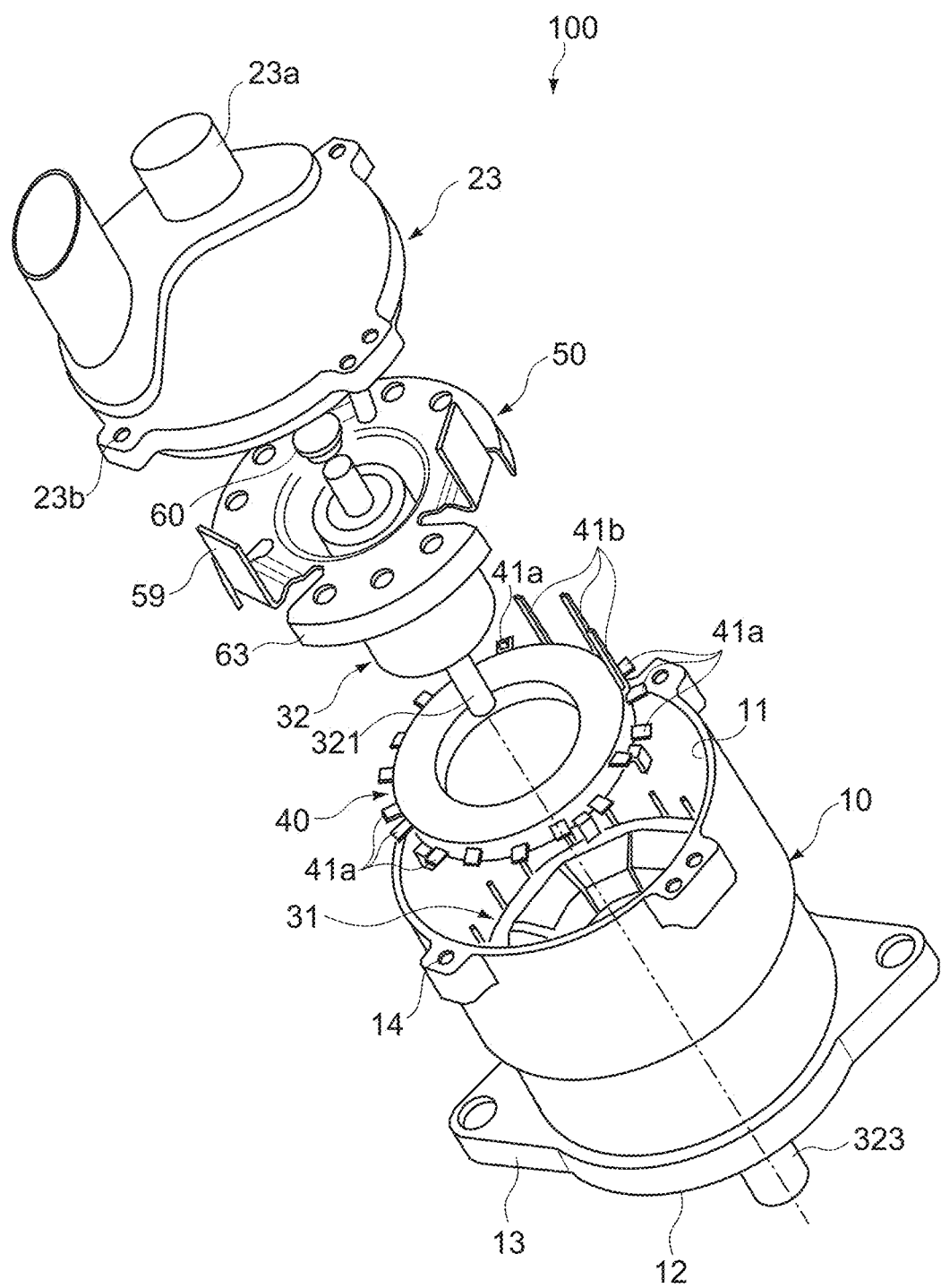
FIG. 1 An exploded perspective view showing a configuration example of a rotating electrical machine which is an electronic apparatus according to an embodiment of the present invention.
Figure 2:
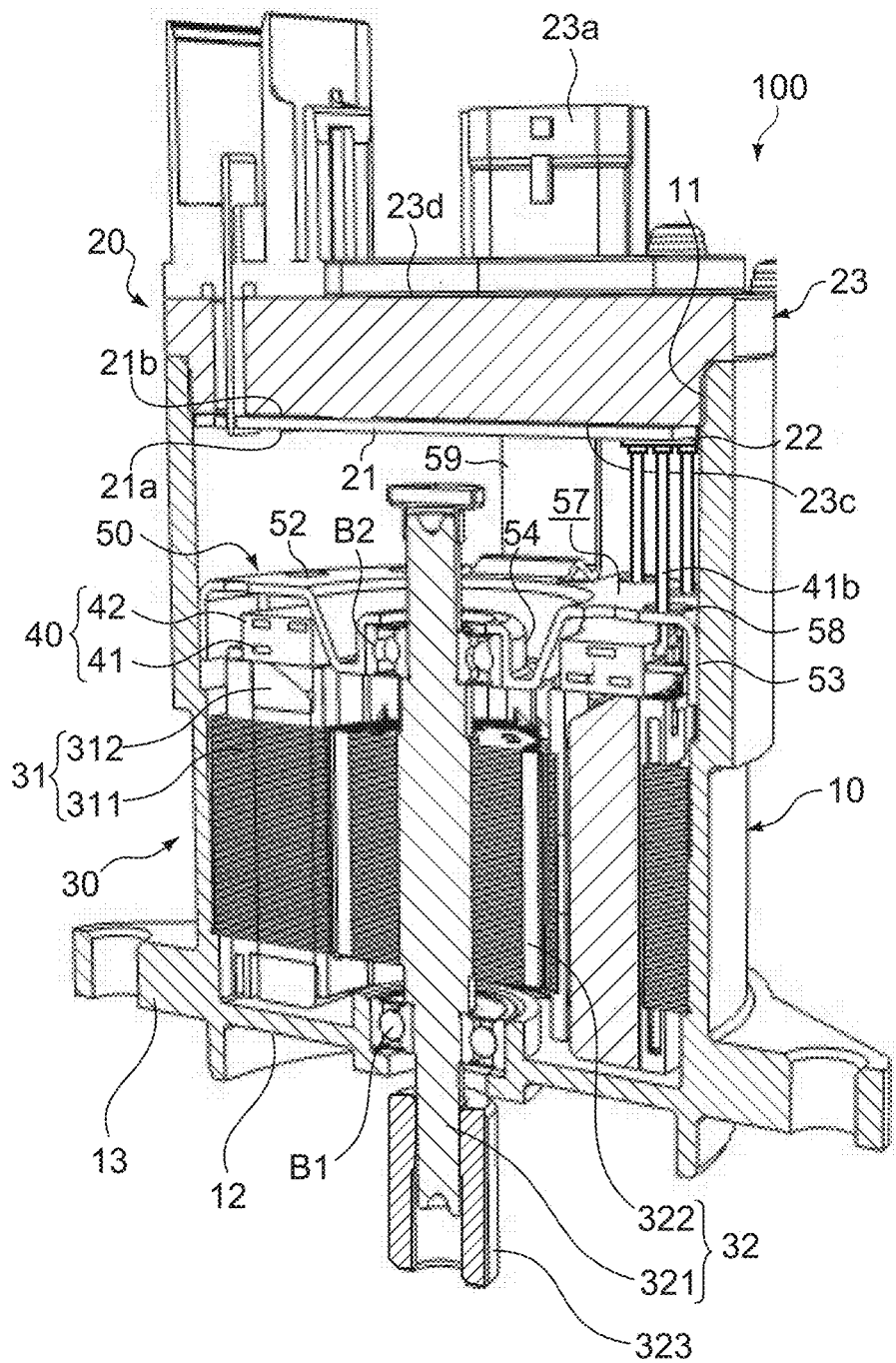
FIG. 2 A perspective view of a cross-section of a main part of the rotating electrical machine.

FIG. 1 is an exploded perspective view showing a configuration example of a rotating electrical machine 100 which is an electronic apparatus according to an embodiment of the present invention. FIG. 2 is a perspective view of a cross-section of a main part of the rotating electrical machine 100.

The rotating electrical machine 100 includes a casing 10, a component-mounting device 20, a motor 30, a busbar unit 40, and a retaining member 50.

[Casing]

The casing 10 is formed in a roughly cylindrical shape including an opening portion 11 and a bottom portion 12 opposite to the opening portion 11. The casing 10 is constituted by a metal material such as aluminum. As shown in FIG. 2, the casing 10 houses the motor 30, the busbar unit 40, and the like.

[Component-Mounting Device]

As shown in FIG. 2, the component-mounting device 20 is retained at an upper end portion of the casing 10 above the motor 30, the busbar unit 40, and the retaining member 50. The component-mounting device 20 includes a component-mounting board 21, a connector component 22, a heat sink 23, first and second screw portions 24 and 25 (see FIGS. 3 and 4). Hereinafter, a configuration of the component-mounting device 20 will be described in detail.

(Component-Mounting Board)

Figure 3:
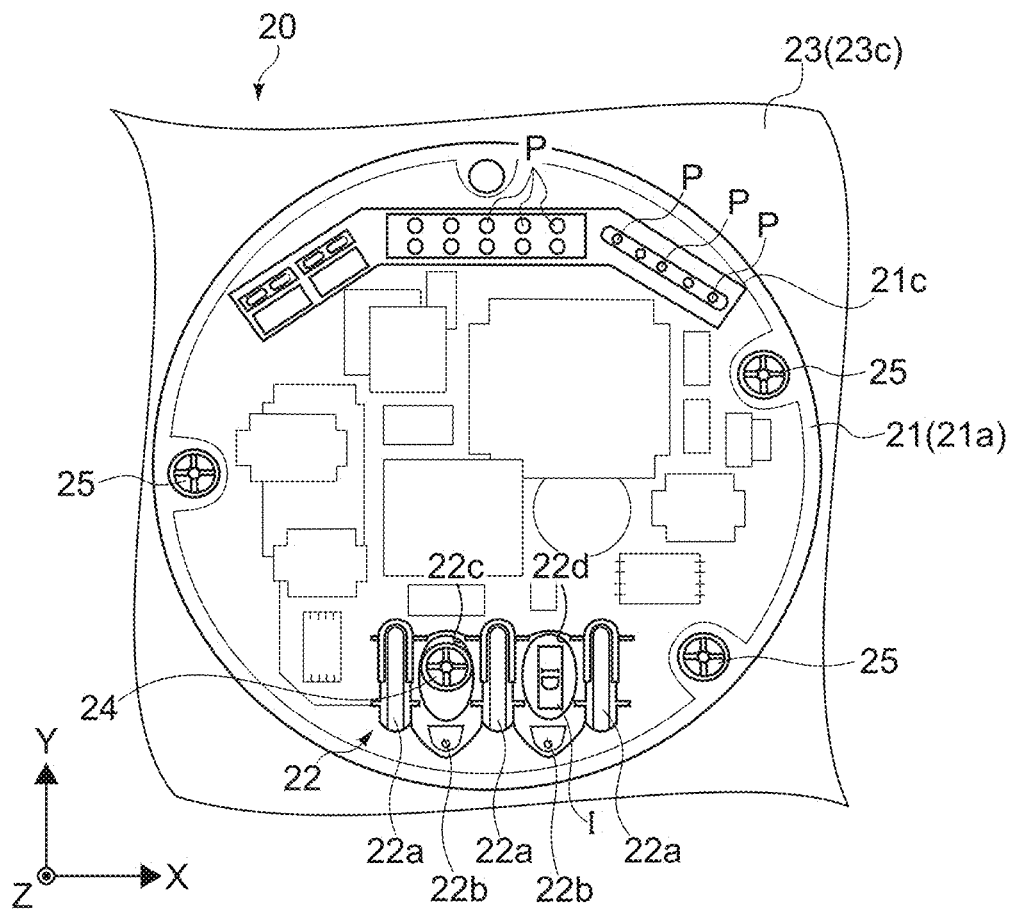
FIG. 3 A plan view of a component-mounting board of a component-mounting device mounted on the rotating electrical machine.
Figure 4:
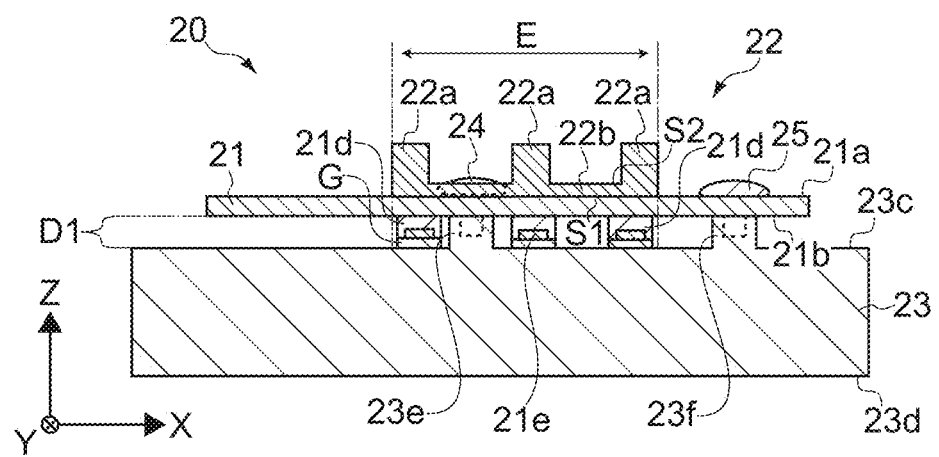
FIG. 4 A cross-sectional view schematically showing a configuration of the component-mounting device.

FIG. 3 is a plan view of the component-mounting board 21 as viewed from the side of the retaining member 50. FIG. 4 is a cross-sectional view schematically showing a configuration of the component-mounting device 20. It should be noted that the X, Y, and Z-axis directions shown in those figures indicate three axis directions orthogonal to one another and the same applies to the following figures.

The component-mounting board 21 includes, as shown in FIGS. 2 and 4, a first surface 21a and a second surface 21b opposite to the first surface 21a. The component-mounting board 21 according to this embodiment is a circuit board including various electronic apparatuses (not shown) that constitute an engine control unit (ECU) of an electronic power steering (EPS). Examples of the electronic apparatus include a central processing unit (CPU) and a memory. The component-mounting board 21 is, as shown in FIG. 4, fixed to the heat sink 23 via the plurality of screw portions 24 and 25 to be described later.

Further, the component-mounting board 21 includes heat-generating components 21d mounted on the second surface 21b as shown in FIG. 4. The heat-generating components 21d dissipate its own heat to the heat sink 23 through an insulative, heat dissipative grease layer G. In this embodiment, a switching device such as a power metal-oxide-semiconductor field-effect transistor (MOSFET) is typically employed as the heat-generating components 21d, though not limited thereto. For example, various electronic components such as a diode, a thyristor, and an insulated gate bipolar transistor (IGBT) may be employed.

The heat-generating components 21d includes heat-dissipating electrodes 21e as shown in FIG. 4. The heat-dissipating electrodes 21e are provided inside the heat-generating components 21d on an inner surface 23c side of the heat sink. The heat-dissipating electrodes 21e are held in contact with the heat dissipative grease layer G.

Therefore, the heat dissipative grease layer G according to this embodiment is provided between the heat-dissipating electrodes 21e and the heat sink 23 as shown in FIG. 4. The heat dissipative grease layer G thermally connects the heat-dissipating electrodes 21e to the heat sink 21.

Accordingly, for example, the heat-dissipating electrodes 21e are used at positions in the heat-generating components 21d, at which the temperature can be high, and are exposed on the inner surface 23c side. In this manner, heat of the component-mounting board 21 (heat-generating components 21d) can be made to escape to the heat sink 23 through the heat dissipative grease layer G. The heat dissipation property of the component-mounting device 20 is thus enhanced.

Further, the heat-generating components 21d according to this embodiment are at least partly mounted on the second surface 21b within a region E that faces the connector component 22 in the Z-axis direction with the component-mounting board 21 interposed therebetween. That is, the heat-generating components 21d are mounted on the second surface 21b so as to at least partly overlap the region E in which the connector component 22 is provided as viewed in the Z-axis direction.

Accordingly, even with the connector component 22 that occupies a large space on the component-mounting board 21, the heat-generating components 21d are mounted on the second surface 21b at positions close to a first screw seat 23e. Therefore, even if the component-mounting board 21 warps in a direction away from the heat sink 23 (see FIG. 7), the heat-generating components 21d and the heat sink 23 can be securely thermally connected to each other.

In addition, as shown in FIG. 3, the component-mounting board 21 includes a terminal-joining region 21c at a part of its rim (edge), the part being located opposite to the connector component 22 in the Y-axis direction. The terminal joining region 21c includes a plurality of terminal portions P electrically connected to an external connection terminal 23a to be described later. The terminal portions P according to this embodiment are connector pins and inserted and mounted on the first surface 21a within the terminal joining region 21c by a flow soldering method, for example.

The component-mounting board 21 according to this embodiment is typically a glass-epoxy board, though not limited thereto. For example, a ceramic board or the like may be employed. Further, the shape of the component-mounting board 21 is also not limited to the circular shape as shown in FIG. 3. For example, a rectangular shape, an elliptical shape, a triangular shape, or the like may be employed.

(Connector Component)

The connector component 22 is provided on the first surface 21a in the edge of the component-mounting board 21 in the Y-axis direction. The connector component 22 includes terminal-fixing portions 22a, a plurality of base portions 22b, a first opening portion 22c, and a second opening portion 22d.

As shown in FIG. 3, the plurality of terminal-fixing portions 22a are provided at predetermined intervals in the X-axis direction and project in the Z-axis direction. As shown in FIG. 2, the terminal-fixing portions 22a are configured to fix power supply terminals 41b of the busbar unit 40 extending toward the component-mounting board 21 in the Z-axis direction.

Accordingly, the terminal-fixing portions 22a are electrically connected to the power supply terminals 41b of the busbar unit 40. It should be noted that the number of terminal-fixing portions 22a is determined as appropriate in accordance with the number of power supply terminals 41b. In this embodiment, three terminal-fixing portions 22a are provided, though not limited thereto. Two or four or more terminal-fixing portions 22a may be provided.

The plurality of base portions 22b is constituted by the base portions 22b that each connect between respective ones of the plurality of terminal-fixing portions 22a. The base portions 22b are connecting members that each connect between the plurality of terminal-fixing portions 22a. Each of the base portions 22b includes, as shown in FIG. 4, a main surface S1 which faces the first surface 21a of the component-mounting board 21 and a main surface S2 opposite to the main surface S1.

The first and second opening portions 22c and 22d are formed in the plurality of base portions 22b as shown in FIG. 3. The first and second opening portions 22c and 22d are through-holes that provide communication between both the main surfaces S1 and S2 of the base portions 22b. Accordingly, the first surface 21a in the opening portion 22c is exposed in the Z-axis direction.

The number of first and second opening portions 22c and 22d is determined as appropriate in accordance with the number of base portions 22b. In this embodiment, the first and second opening portions 22c and 22d are respectively formed in the plurality of bases 22b, though not limited thereto. For example, the first and second opening portions 22c and 22d according to this embodiment may be formed in each of the plurality of bases 22b.

The shape of the opening portion 22c is not limited to the elliptical shape as shown in FIG. 3. Any shape such as a circular shape, a rectangular shape, and a triangular shape can be employed.

The constituent material of the connector component 22 typically includes a synthetic resin such as polybutylene terephthalate (PBT). Further, the connector component 22 according to this embodiment is typically a press-fit connector, though not limited to the connector of this type as a matter of course.

(Heat Sink)

Facing the second surface 21b of the component-mounting board 21 in the Z-axis direction, the heat sink 23 is attached to the opening portion 11 of the casing 10 via a seal ring. In this manner, the heat sink 23 constitutes a lid portion that hermetically seals the inside of the casing 10. A plurality of brackets 23b having screw insertion holes is provided in a circumferential portion of the heat sink 23 as shown in FIG. 1. Those brackets 23b are fixed to a plurality of fixing brackets 14 provided at a circumferential portion of the opening portion 11 of the heat sink 23 with screws.

A breathing hole that can provide communication between the inside of the casing 10 and the external air may be provided in the heat sink 23. The heat sink 23 includes, as shown in FIGS. 2 and 4, an outer surface 23d provided with the external connection terminal 23a to be electrically connected to an external power supply (not shown) and the inner surface 23c that faces the second surface 21b of the component-mounting board 21 to be electrically connected to the busbar unit 40.

The heat sink 23 is typically constituted by a block made of a metal material and has a function of dissipating heat of the component-mounting board 21 (heat-generating components 21d). The constituent material of the heat sink 23 may be the same kind of material as the casing 10 or may be a material different from that of the casing 10.

As shown in FIG. 4, the heat sink 23 according to this embodiment includes first and second screw seats 23e and 23f that project from the inner surface 23c toward the component-mounting board 21.

The first screw seat 23e faces the base portions 22b (first opening portion 22c) of the connector component 22 in the Z-axis direction with the component-mounting board 21 interposed therebetween. The first screw seat 23e is provided within the region E on the inner surface 23c, which faces the connector component 22 with the component-mounting board 21 interposed therebetween. The first screw seat 23e is held in contact with the second surface 21b of the component-mounting board 21.

Accordingly, the first screw seat 23e functions as a supporting portion (first supporting portion) that supports the component-mounting board 21 within the region E. It should be noted that the number of first screw seats 23e is determined as appropriate in accordance with the configuration of the connector component 22. In this embodiment, one first screw seat 23e is provided, though not limited thereto. A plurality of first screw seats 23e may be provided.

Further, the first screw seat 23e according to this embodiment has a height D1 such that the heat-generating components 21d provided between the component-mounting board 21 and the heat sink 23 (inner surface 23c) is held in contact with the inner surface 23c with the heat dissipative grease layer G interposed therebetween. Accordingly, the heat-generating components 21d are thermally connected to the heat sink 23 through the heat dissipative grease layer G. With the component-mounting board 21 fixed to the heat sink 23, the heat dissipation property of the heat-generating components 21d is maintained.

The second screw seats 23f face the edge of the component-mounting board 21 in the Z-axis direction and are held in contact with the second surface 21b. Accordingly, the second screw seats 23f each function as a supporting portion (second supporting portion) that supports the edge of the component-mounting board 21. It should be noted that the number of second screw seats 23f can be modified as appropriate. In this embodiment, three second screw seats 23f are provided, though not limited thereto. A single second screw seat 23f or a plurality of second screw seats 23f may be provided.

(First Screw Portion)

As shown in FIG. 3, the first screw portion 24 is disposed in the first opening portion 22c formed in the base portion 22b of the connector component 22 and is engaged with the first screw seat 23e through the component-mounting board 21. The number of first screw portions 24 is determined as appropriate in accordance with the number of first screw seats 23e. In this embodiment, a single first screw portion 24 is provided, though not limited thereto. A plurality of first screw portions 24 may be provided.

The first screw portion 24 is typically constituted by a metal material, though not limited thereto. For example, the first screw portion 24 may be constituted by a non-metal such as a plastic material and a rubber material or may be constituted by a combination of a metal material and a non-metal material.

(Second Screw Portion)

The second screw portions 25 are engaged with the second screw seats 23f through the edge of the component-mounting board 21. The second screw portions 25 is determined as appropriate in accordance with the number of second screw seats 23f In this embodiment, three second screw portions 25 are provided, though not limited thereto. A single second screw portion 25 or a plurality of second screw portions 25 may be provided.

Each of the second screw portions 25 is typically constituted by a metal material, though not limited thereto. For example, the second screw portion 25 may be constituted by a non-metal such as a plastic material and a rubber material or may be constituted by a combination of a metal material and a non-metal material. Further, the constituent material of the second screw portion 25 may be the same kind of material as the first screw portion 24 or may be a material different from that of the first screw portion 24.

[Motor]

As shown in FIG. 2, the motor 30 is housed in the casing 10 and includes a stator 31 and a rotor 32. The stator 31 includes a stator core 311 disposed inside the casing 10 and a stator coil 312 wound around the stator core 311. The stator core 311 is constituted by a magnetic material. The stator core 311 is constituted by a plurality of laminated magnetic rigid plates, for example.

The stator core 311 is fixed to the casing 10 by being fitted into the casing 10. The stator coil 312 includes U-phase, V-phase, and W-phase electromagnetic coils and the end portions of those coils are electrically connected to the busbar unit 40.

The rotor 32 includes a drive shaft 321 and a rotor core 322 attached to the drive shaft 321. The drive shaft 321 is disposed along the axial center of the casing 10 and is press-fitted in a through-hole formed in the center of the rotor core 322. The drive shaft 321 is rotatably supported on the casing 10 via a bearing B1 (first bearing) and a bearing B2 (second bearing). The rotor core 322 includes a plurality of magnetic poles arranged in a circumferential direction. The rotor 32 is disposed inside the stator 31 and rotates the drive shaft 321 around the axis by electromagnetic action with the stator 31.

The one end (lower end in FIGS. 1 and 2) of the drive shaft 321 penetrates the bottom portion 12 of the casing 10 and this end is provided with a gear portion 323. The gear portion 323 meshes with a gear (not shown) on the counterpart side that communicates with a steering shaft and transmits rotation of the drive shaft 321 to the steering shaft. The casing 10 includes, at the bottom portion 12, a flange portion 13 to be connected to a device on the counterpart side and is connected to the device via a plurality of bolts.

The other end (upper end in FIGS. 1 and 2) of the drive shaft 321 faces a lower surface of the heat sink 23 with a distance. A magnet 60 is fixed to the other end of the drive shaft 321. The r.p.m. of the rotor 32 is detected via a magnetic sensor (not shown) on the component-mounting board 21 that faces this magnet 60.

The one bearing B1 (first bearing) is attached to the bottom portion 12 of the casing 10 and rotatably supports the one end of the drive shaft 321. The other bearing B2 (second bearing) rotatably supports the other end of the drive shaft 321. The bearing B2 is disposed between the rotor core 322 and the heat sink 23 and is fixed to the casing 10 via the retaining member 50.

[Busbar Unit]

The busbar unit 40 includes a plurality of busbars 41 constituted by an electrically conductive material and an electrically insulative busbar holder 42 that holds those busbars 41 therein (see FIG. 2). The busbar holder 42 is constituted by an annular molded material. The plurality of busbars 41 includes a plurality of connection terminals 41a that projects radially outward from an outer circumferential surface of the busbar holder 42 and a plurality of power supply terminals 41b that extends in the one axis direction from a top surface of the busbar holder 42 and corresponds to each of the U-phase, the V-phase, and the Z-phase (see FIG. 1).

The busbar unit 40 is disposed inside the casing 10 and is connected to the stator coil 312 concentrically with the drive shaft 321. The plurality of connection terminals 41a is each electrically connected to one end of the stator coil 312 in the U-phase, the V-phase, and the W-phase. The plurality of power supply terminals 41b is electrically connected to the connector component 22 on the component-mounting board 21 fixed to the heat sink 23.

[Retaining Member]

The retaining member 50 is for positioning and retaining the bearing B2 in the casing 10 and is constituted by a material obtained by press-forming a metal plate. In this embodiment, the retaining member 50 can be one obtained by deep-drawing and bending a metal plate into a solid shape, for example. When the retaining member 50 is constituted by a metal material, frictional heat generated at the bearing B2 can be made to efficiently escape to the casing 10 via the retaining member 50. The heat dissipation property of the bearing B2 is thus enhanced. The metal plate that constitutes the retaining member 50 is not particularly limited. The metal plate has a thickness such that the necessary strength of the retaining member 50 is secured and the retaining member 50 can be appropriately elastically deformed.

The retaining member 50 may be constituted by a magnetic material or may be constituted by a non-magnetic material. When the retaining member 50 is constituted by a magnetic material, a shield effect of protecting electronic components on the component-mounting board 21 from the influence of electromagnetic fields generated from the stator 31 and the rotor 32 can be provided. Such a material can be, for example, a steel plate cold commercial (SPCC), though not limited thereto.

<Actions>

Figure 5:
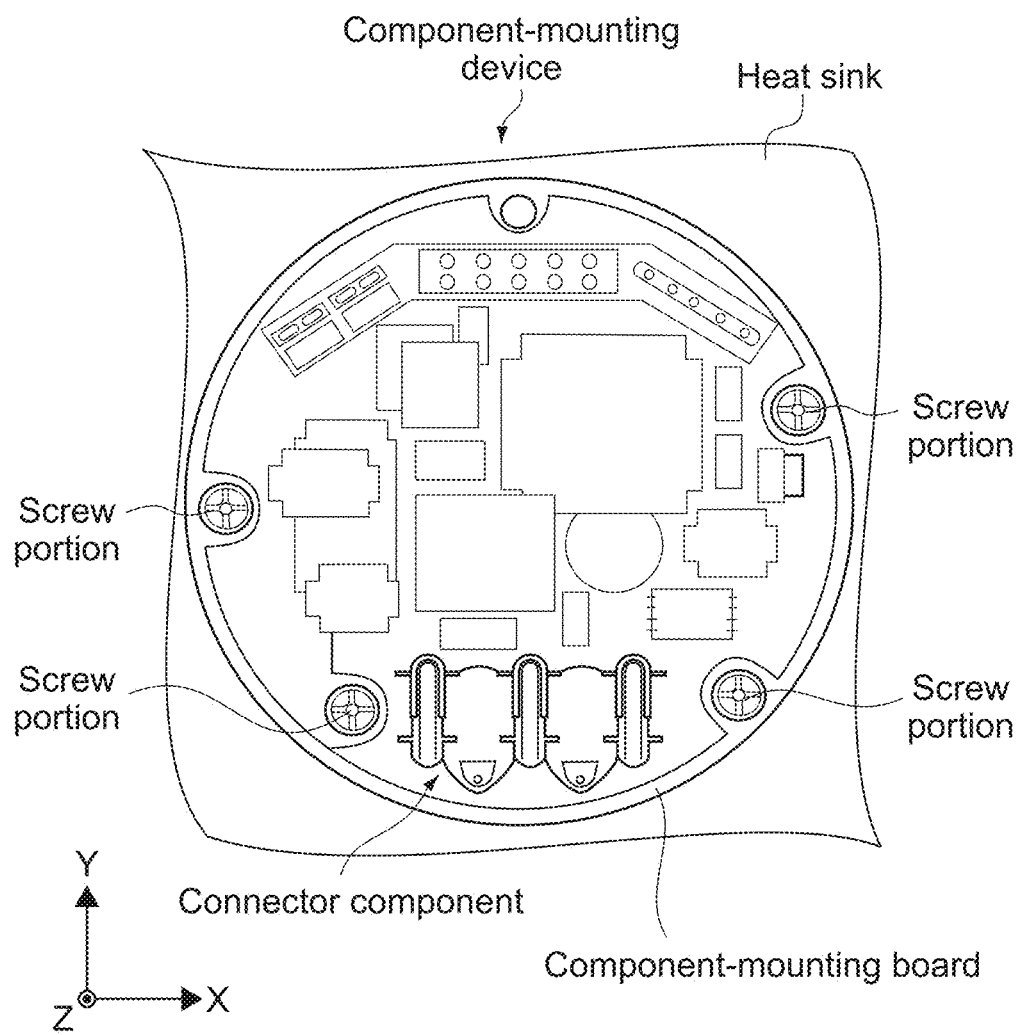
FIG. 5 A plan view of a component-mounting board mounted on a conventional component-mounting device.

Next, actions of the component-mounting device 20 according to this embodiment will be described in comparison with a conventional component-mounting device. FIG. 5 is a plan view of a component-mounting board in a component-mounting device according to the comparative example. Further, FIGS. 6 and 7 are cross-sectional views each schematically showing a configuration of the conventional component-mounting device, each showing deformation of the component-mounting board.

Figure 6:
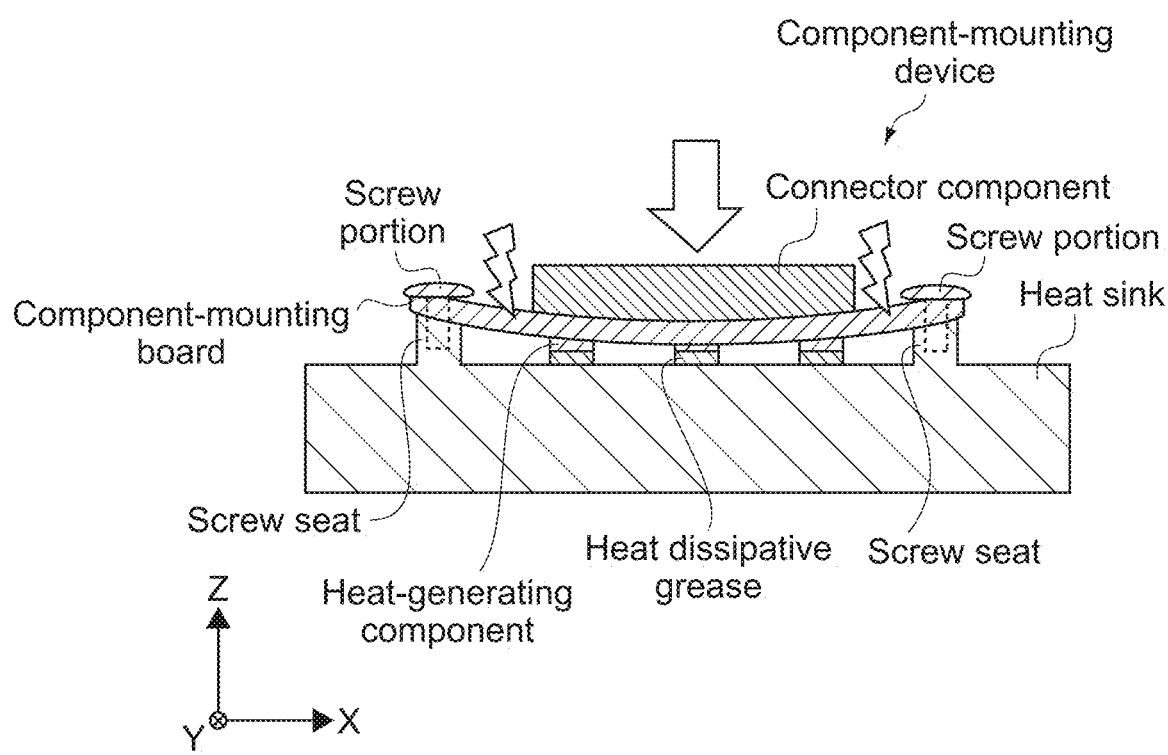
FIG. 6 A cross-sectional view schematically showing a configuration of the component-mounting device.

On the component-mounting board according to the comparative example, the distance between the plurality of screw seats in the X-axis direction near the connector component is longer as shown in FIGS. 5 and 6. Accordingly, when press-fitting and fixing the terminals of the motor busbars or the like to the terminals of the connector component in the Z-axis direction, unnecessary bending stress may be applied on the component-mounting board fixed on the screw seats with the screws, and the board may be damaged and the quality of the electronic apparatus may be lowered.

Figure 7:
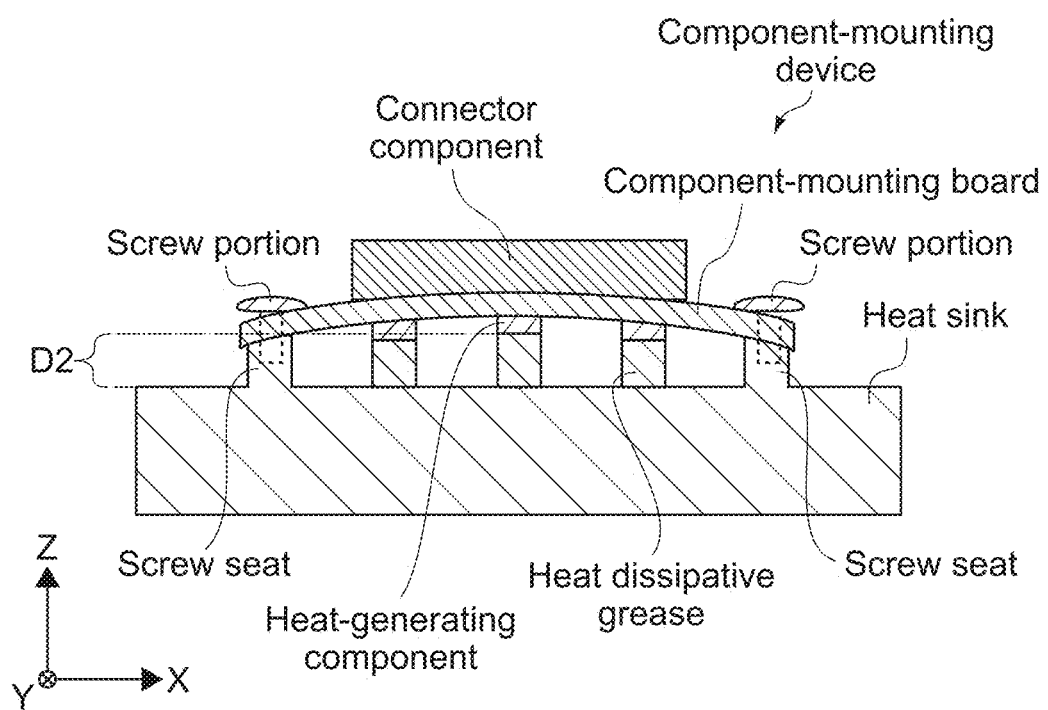
FIG. 7 A cross-sectional view schematically showing a configuration of the component-mounting device.

Further, if the component-mounting board warps in a direction away from the heat sink (if the component-mounting board warps in a convex shape upward in the Z-axis direction) in the manufacture process for the electronic apparatus as shown in FIG. 7, a distance D2 between the heat-generating component and the heat sink increases and the heat dissipation property of the heat-generating component is thus lowered.

On the other hand, the component-mounting device 20 according to this embodiment takes a configuration in which the distance between the first screw seat 23e and the second screw seats 23f in the X-axis direction near the connector component 22 is relatively short and the first screw seat 23e supports the component-mounting board 21 within the region E that faces the connector component 22 with the component-mounting board 21 interposed therebetween (see FIG. 4).

Accordingly, when press-fitting and fixing the power supply terminals 41b of the busbar unit 40 to the terminal-fixing portions 22a in the Z-axis direction, reaction depending on stress, which is applied by the power supply terminals 41b on the component-mounting board 21 in parallel to the Z-axis direction, is added to the component-mounting board 21 from the first screw seat 23e. Accordingly, bending stress to the component-mounting board 21 due to press-fitting of the power supply terminals 41b in the terminal-fixing portions 22a is reduced. Therefore, the quality of the rotating electrical machine 100 is inhibited from lowering due to deformation of the component-mounting board 21.

Further, as shown in FIG. 3, the component-mounting device 20 takes a configuration in which the first screw portion 24 is disposed in the first opening portion 22c formed on the base portions 22b of the connector component 22. The space above the component-mounting board 21 can be efficiently used and the degree of freedom in design is enhanced.

In addition, the component-mounting device 20 according to this embodiment takes a configuration in which the first screw portion 24 is engaged with the first screw seat 23e provided within the region E through the component-mounting board 21. Accordingly, even if a warp of the component-mounting board 21 is caused as shown in FIG. 7 in the manufacture process for the rotating electrical machine 100, the warp is corrected by engaging the first screw portion 24 with the first screw seat 23e. The state in which the heat-generating components 21d are thermally connected to the heat sink 23 through the grease layer G is maintained. Therefore, the heat dissipation property of the heat-generating components 21d is inhibited from lowering due to deformation of the component-mounting board 21.

Modified Example

Hereinafter, the embodiment of the present invention has been described, the present invention is not limited only to such an embodiment and various modifications can be made as a matter of course.

For example, in the above-mentioned embodiment, the first screw portion 24 is disposed only in the first opening portion 22c of the first and second opening portions 22c and 22d formed in the base portions 22b of the connector component 22, though not limited thereto. First screw portions 24 may be disposed in the first and second opening portions 22c and 22d or the first screw portion 24 may be disposed only in the second opening portion 22d.

In addition, in the above-mentioned embodiment, the screw portion is disposed in the first opening portion 22c of the first and second opening portions 22c and 22d formed in the base portions 22b of the connector component 22 and the second opening portion 22d is empty, though not limited thereto.

For example, in the component-mounting device 20 according to the present invention, a configuration in which the first surface 21a includes an identifier I disposed in the second opening portion 22d as shown in FIG. 3 may be employed. Specifically, the identifier I may be printed on the first surface 21a in the second opening portion 22d. It should be noted that the identifier I is identification information such as a barcode and a QR code (registered trademark) for identifying the part number or model number of the board 21, for example.

Besides, in the component-mounting board 20 according to the present invention, the screw portion may be disposed in the first opening portion 22c and various components such as a filter capacitor may be disposed in the second opening portion 22d.

Moreover, in the above-mentioned embodiment, the rotating electrical machine 100 to be used for an electric power steering apparatus for a vehicle has been shown as an example of the electronic apparatus. The rotating electrical machine 100 can also be applied to a rotating electrical machine (motor) for other uses. In addition, the electronic apparatus according to the present invention can be applied not only to the motor but also to other rotating electrical machines such as an electric generator. In addition, the electronic apparatus according to the present invention can also be applied to electronic apparatuses other than the rotating electrical machine.

The invention claimed is:

1. A component-mounting device, comprising:
  a component-mounting board including
    a first surface and
    a second surface opposite to the first surface;
  a connector component including
    a plurality of terminal-fixing portions that fixes a terminal extending in one axis direction orthogonal to the first surface and a base portion that connects between the plurality of terminal-fixing portions and includes an opening portion, the connector component being provided on the first surface;

a heat sink that faces the second surface and includes a first screw seat that faces the base portion in the one axis direction with the component-mounting board interposed between the first screw seat and the base portion; and a first screw portion that is disposed inside the opening portion and is engaged with the first screw seat through the component-mounting board.

2. The component-mounting device according to claim 1, wherein the component-mounting board further includes a heat-generating component mounted on the second surface, and the first screw seat has a height such that the heat-generating component is thermally connected to the heat sink.

3. The component-mounting device according to claim 2, wherein the heat-generating component includes a metal, heat dissipation electrode, the component-mounting device further comprising a grease layer that is provided between the heat dissipation electrode and the heat sink and thermally connects the heat dissipation electrode to the heat sink.

4. The component-mounting device according to claim 2, wherein the heat-generating component is at least partly mounted on the second surface within a region that faces the connector component in the one axis direction with the component-mounting board interposed between the region and the connector component.

5. The component-mounting device according to claim 1, wherein the connector component includes a plurality of base portions comprises the base portion that connects between respective ones of the plurality of terminal-fixing portions and first and second opening portions formed in the plurality of base portions, the first screw portion is disposed in the first opening portion, and the first surface includes an identifier disposed in the second opening portion.

6. An electronic apparatus, comprising:

a motor;

a busbar unit that electrically connects to the motor and includes a terminal that extends in one axis direction; and a component-mounting device including a component-mounting board including a first surface and a second surface opposite to the first surface, a connector component including a plurality of terminal-fixing portions that fixes the terminal and a base portion that connects between the plurality of terminal-fixing portions and includes an opening portion, the connector component being provided on the first surface, a heat sink that faces the second surface and includes a screw seat that faces the base in the one axis direction with the component-mounting board interposed between the screw seat and the base, and a screw portion that is disposed inside the opening portion and is engaged with the screw seat through the component-mounting board.

* * * * *